United States Patent

Kweon et al.

[11] Patent Number: 5,834,832
[45] Date of Patent: Nov. 10, 1998

[54] PACKING STRUCTURE OF SEMICONDUCTOR PACKAGES

[75] Inventors: Young Do Kweon, Seoul; Jung Jin Kim, Inchun; Young Jae Song; Young Hee Song, both of Seongnam; Joung Rhang Lee, Seoul, all of Rep. of Korea

[73] Assignee: Samsung Electronics Co., Ltd., Suwon, Rep. of Korea

[21] Appl. No.: 769,799

[22] Filed: Dec. 17, 1996

Related U.S. Application Data

[63] Continuation of Ser. No. 479,437, Jun. 7, 1995, abandoned.

[30] Foreign Application Priority Data

Jun. 9, 1994 [KR] Rep. of Korea ................. 1994-12953
Jun. 16, 1994 [KR] Rep. of Korea ................. 1994-13564

[51] Int. Cl.$^6$ .......................... H01L 23/495; H01L 23/02; H01L 23/34
[52] U.S. Cl. .......................... 257/676; 257/924; 257/700; 257/723; 257/532
[58] Field of Search .................................. 257/924, 700, 257/723, 780, 532

[56] References Cited

U.S. PATENT DOCUMENTS

| | | | |
|---|---|---|---|
| 3,880,493 | 4/1975 | Lockhart, Jr. ............................. | 257/723 |
| 4,626,958 | 12/1986 | Lockard et al. ........................ | 257/697 |
| 4,827,327 | 5/1989 | Miyauchi et al. ....................... | 257/700 |
| 4,945,399 | 7/1990 | Brown et al. ............................ | 257/688 |
| 5,028,986 | 7/1991 | Sugano et al. .......................... | 257/686 |
| 5,065,224 | 11/1991 | Fraser et al. ............................ | 257/666 |

FOREIGN PATENT DOCUMENTS

| | | | |
|---|---|---|---|
| 57-49259 | 3/1982 | Japan .................................... | 257/723 |
| 62-183155 | 8/1987 | Japan .................................... | 257/723 |
| 2-82541 | 3/1990 | Japan .................................... | 257/780 |
| 5-109974 | 4/1993 | Japan .................................... | 257/924 |
| 6-132472 | 5/1994 | Japan .................................... | 257/924 |

OTHER PUBLICATIONS

Lineback et al., "SMD Invasion of PC Boards Gains Headway", Electronics Week, pp. 17–18, Nov. 19, 1984.

*Primary Examiner*—Teresa M. Arroyo
*Attorney, Agent, or Firm*—IP Group of Pillsbury Madison & Sutro LLP

[57] ABSTRACT

A packing structure for a surface mounting type semiconductor package, wherein at least one semiconductor chips are mounted on a die pad. A conductive pattern is formed on a printed circuit board which is located beneath an exposed side of a die pad of the package. A nonconductive thin film or a conductive layer is formed between the conductive pattern and the die pad. The conductive pattern is electrically connected to the die pad so that there is generated the package voltage difference therebetween, thereby reducing the electric noise of the package and facilitating high speed operation of the package without reducing a mounting density.

15 Claims, 5 Drawing Sheets

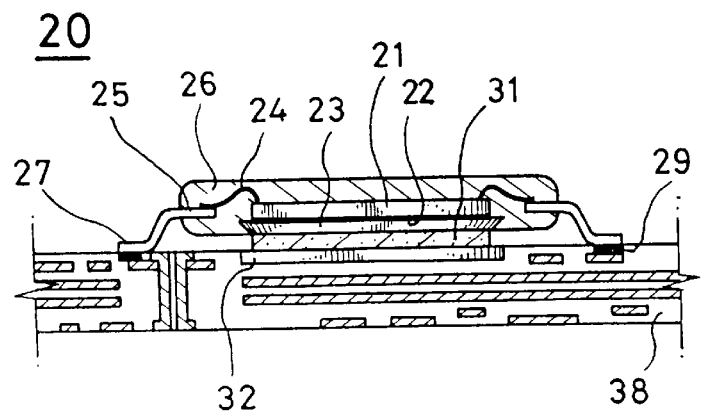
FIG. 3A
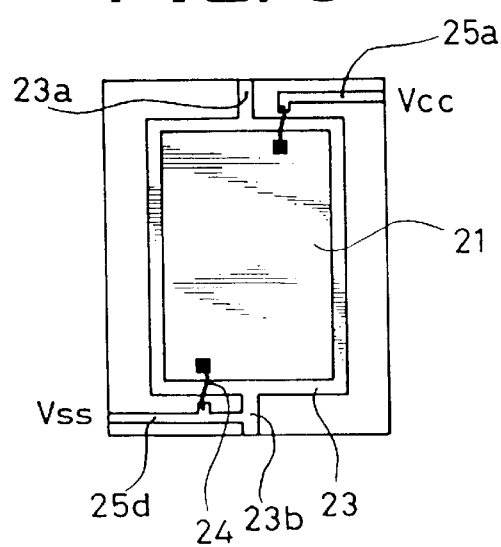
FIG. 3B
FIG. 3C

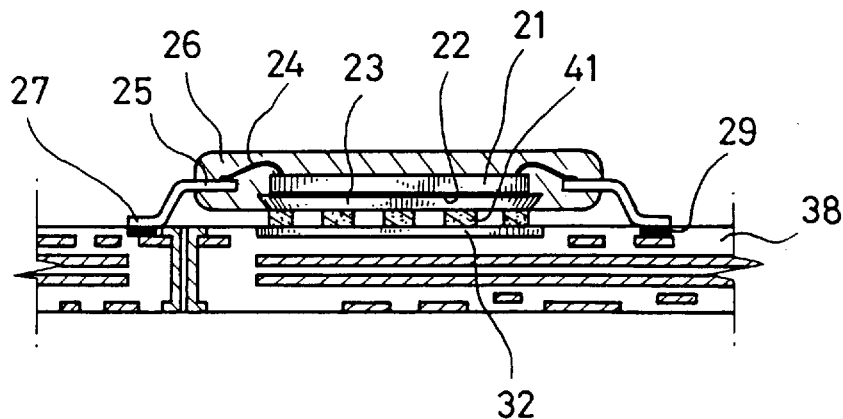
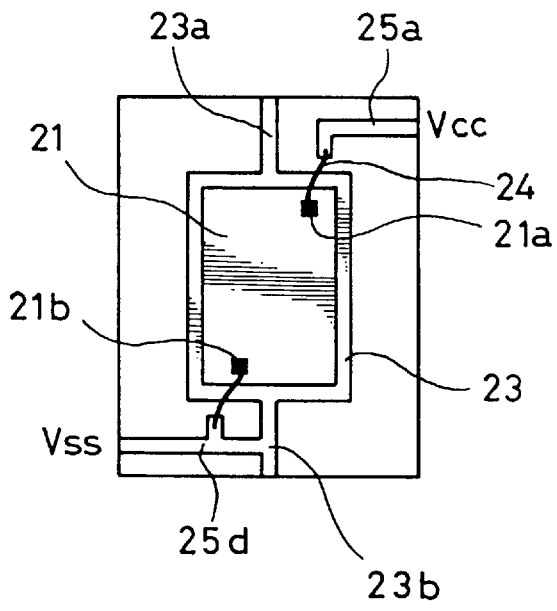
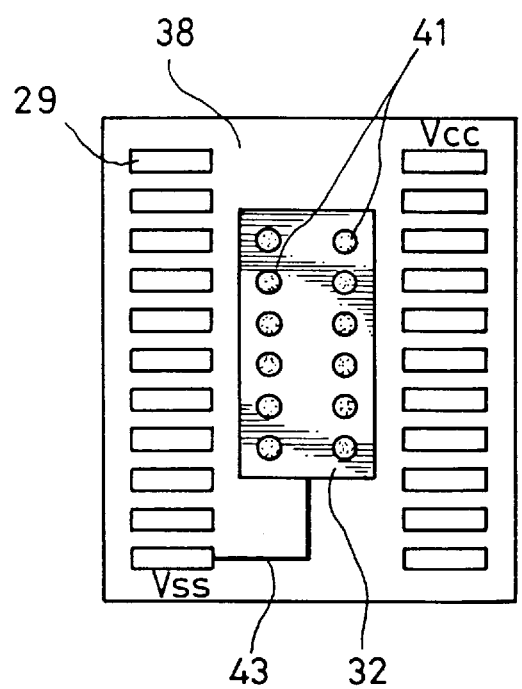

PACKING STRUCTURE OF SEMICONDUCTOR PACKAGES

This is a continuation of application Ser. No. 08/479,437, filed on Jun. 7, 1995, which was abandoned upon the filing hereof.

BACKGROUND OF THE INVENTION

1. Field of the Invention

The present invention relates generally to a packing structure for semiconductor packages, and, more particularly, to a packing structure for a surface-mounting-type semiconductor package, the structure comprising a conductive pattern formed on a printed circuit board which is located beneath an exposed side of a die pad of the package, a nonconductive thin film or a conductive layer formed between the conductive pattern and the die pad, and the conductive pattern being electrically connected to the die pad so as to or not to generate a voltage difference therebetween, thereby allowing reduction of the electrical noise of the package and allowing high speed operation, without reducing the mounting density of the package.

2. Description of the Prior Art

Recently, there has been a trend to make modules and surface-mounting packages compact and thin in order to provide highly dense surface mounting semiconductor packages. In compliance with this trend, compact and thin packages such as TSOP (Thin Small Outline Packages) and UTSOP (Ultra Thin Small Outline Packages) have been developed, and these packages are used mainly for main memory devices of computers.

The integration density of an IC can be increased by forming finely the elements which constitute the IC and the metal wirings which connect these elements, or by increasing the area of a semiconductor chip. However, the former method is difficult to put into a practical use due to limitations present in a respective fabrication process. On the other hand, the latter method also has a disadvantage that the increase in the area of the chip results in an increase in the weight and the area occupied by the package.

To avoid theses problems, methods for increasing the degree of integration by mounting a highly dense packaged module, or by stacking high density chips has heretofore been proposed. A highly dense mounting of chips on a substrate such as a printed circuit board can be accomplished by mounting a plurality of surface-mounting chips or TAB (Tape Automated Bonding) packages on the substrate.

However, as very large scale integrated (LSI) circuits tend to become more complex, there is a need to switch more output driver circuits simultaneously at a faster rate in order to increase the performance thereof. This increase in the switching rate results in an increase in the amount of electrical noise which is associated therewith. Therefore, various attempts for reducing or minimizing the noise associated with the increase in the switching rate have been made.

For example, U.S. Pat. No. 4,945,399 to Brown discloses a semiconductor chip package wherein discrete capacitors, such as a decoupling capacitor, are distributed between the associated voltage pins.

That is to say, as shown in FIG. 1, which is a cross-sectional view of one conventional packing structure of semiconductor packages, a flip chip carrier package (10) is shown having a semiconductor chip (11) and a substrate (13), a printed circuit board, onto which the chip (11) is mounted. On the upper surface of the substrate (13), a bottom metal layer (14), dielectric thin film (15) and a top metal layer are formed in succession. The bonding pad (not shown) of the chip (11) is electrically connected to the pad (17a), (17c) of the top metal layer (16) by solder bumps (18a), (18c), and to the pad (17b) of the bottom metal layer (14) by solder bumps (18b), with penetration into through holes formed in the top metal layer (16) and the dielectric thin film (15). The top and bottom metal layers (16), (14) are electrically connected to voltage pins (19b) of Vcc and (19a) of Vss, and the chip (11) is supplied with signal and power via the pads (17a), (17b) and (17c).

The capacitors disclosed in the U.S. Pat. No. 4,945,399 are electrically connected to the chip by a plurality of wiring lines or large power buses. The wiring lines are a representative exemplary of high inductance paths. And, as the current of the wiring lines increases, the scale of the voltage drop increases, which results in undesired power distribution noise.

Accordingly, when taking account into the arrangement of wiring lines associated with chips, and the size limitation of individual capacitor, it is very difficult to distribute capacitors so as not to cause any power drop or noise. Further, since the capacitors employed for reducing or minimizing the noise are of a high frequency and low inductance capacitor type, they are expensive, and this causes an inevitable increase in the production cost of the respective integrated circuit. To avoid this problem, the capacitors may be formed in the space beneath the package. However, in the case of thin or ultra thin semiconductor packages, the formation of capacitors beneath the package is impossible.

On the other hand, with reference to FIG. 2(A), which is a cross-sectional view of the packing structure a conventional TSOP or SOJ (Small Outline J-banded Package), there can be seen a package (20) wherein a semiconductor chip (21) is bonded to an upper surface of a die pad (23) of a lead frame, using an adhesive (22), and bonding pads (not shown) of the chip (21) are electrically connected to inner leads (25) of the lead frame via bonding wires (24). The chip (21), die pad (23) and bonding wires (24) are encapsulated by an epoxy molding compound (26), to provide protection from the external environment, and the bottom surface of the die pad (23) is exposed beneath the molding (26). The outer leads (27) are electrically connected to land patterns (29) formed on an upper surface of a printed circuit board (28), this printed circuit board having four stacked lines for supplying signals and power to the outer leads.

With reference now to FIG. 2(B), the semiconductor chip (21) is attached to the upper surface of the die pad (23) of the lead frame, contact terminals (23a) (23b) are integrated with the die pad (23) on its both opposite corner, and bonding pads (21a), (21b) formed on the margins of the chip (21) are electrically connected to the inner leads (25a), (25b), which serve as Vcc and Vss voltage terminals, respectively, via the bonding wires (24). The inner leads (25a) and (25b) depart away from the contact terminals (21a), (21b).

With reference now to FIG. 2(C), a plurality of land patterns (29), onto which the outer leads (27) are mounted, are formed on the upper surface of the printed circuit board (28) in the form of two parallel rows; and there is not formed a contact land pattern between these parallel patterns (29).

In the package having the packing structure explained above, inductance of the bonding wires, resistance of the chip, and inductances of the lead frame and of the land are connected in series. Accordingly, the total resistance and inductance of the package become considerably high, and the noise increases, resulting in a decrease in the operation speed.

If one intends to form decoupling capacitors in order to avoid this problem, there is a need to provide a space where the capacitors are formed, resulting eventually in a decrease in the mounting density.

Accordingly, there has been a need to provide a high speed, low noise semiconductor package without a disadvantage of reduction of mounting density. The present invention fulfills this need.

SUMMARY OF THE INVENTION

The present invention provides a packing structure for a semiconductor package, which allows a reduction of the noise, without deteriorating the operation speed or mounting density of the package. The packing structure includes:

- a semiconductor package in which at least one semiconductor chip is mounted on a respective die pad thereof;
- a substrate, onto which the package is mounted, the substrate having a conductive pattern formed on an area of upper surface, thereof the area of the upper surface corresponding to the die pad; and
- a nonconductive thin film as a capacitor formed in a space between the die pad and the conductive pattern, the space having a voltage difference.

The present invention encompasses another packing structure for a semiconductor package, which allows a reduction of the noise without deteriorating the operation speed or mounting density of the package. The packing structure includes:

- a semiconductor package in which at least one semiconductor chip is mounted on a die pad thereof;
- a substrate, onto which the package is mounted, having a conductive pattern formed on an area of the upper surface surface thereof, the area corresponding to the die pad; and
- at least one conductive layer formed in a space between the die pad and the conductive pattern, and there is no voltage difference therebetween.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 3(A) is a cross-sectional view of a preferred packing structure for semiconductor packages according to the present invention;

FIG. 3(B) is a plan view of the packing structure depicted in FIG. 3(A), prior to molding;

FIG. 3(C) is a plan view depicting a land pattern on a printed circuit board of the packing structure depicted in FIG. 3(A);

FIG. 4 is a cross-sectional view of another preferred packing structure for semiconductor packages according to the present invention;

FIG. 5(A) is a plan view of the packing structure depicted in FIG. 4, prior to molding;

FIG. 5(B) is a plan view depicting a land pattern on a printed circuit board of the packing structure depicted in FIG. 4;

DETAILED DESCRIPTION OF PREFERRED EMBODIMENTS OF THE INVENTION

Figure 1:
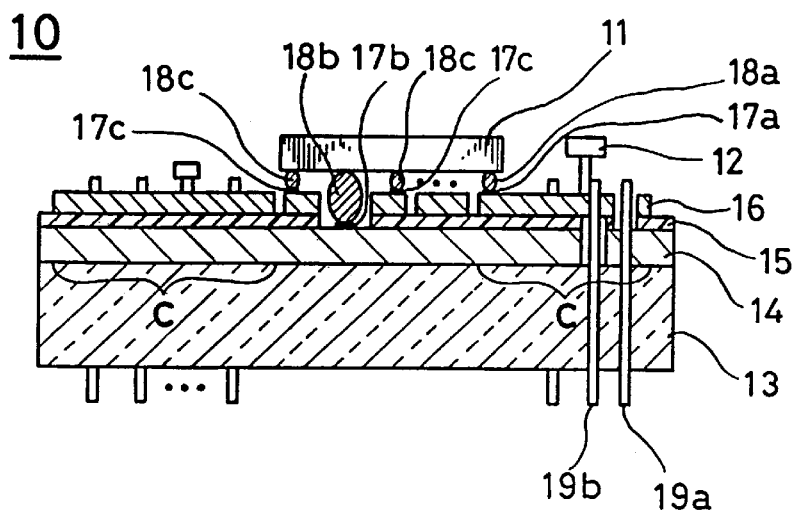
FIG. 1 is a cross-sectional view of one conventional packing structure for semiconductor packages.
Figure 2A:
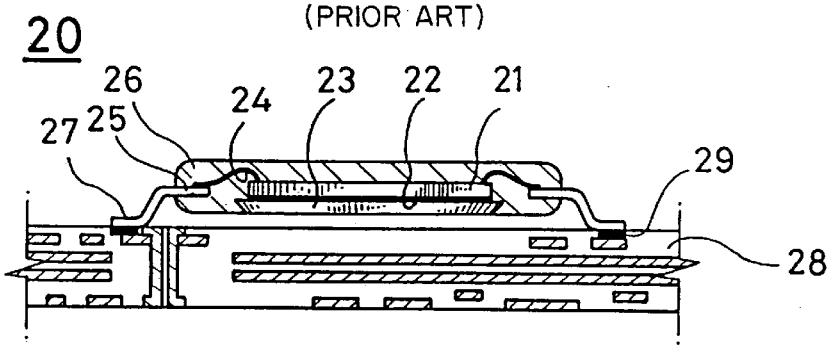
FIG. 2(A) is a cross-sectional view of another conventional packing structure of for semiconductor packages.
Figure 2B:
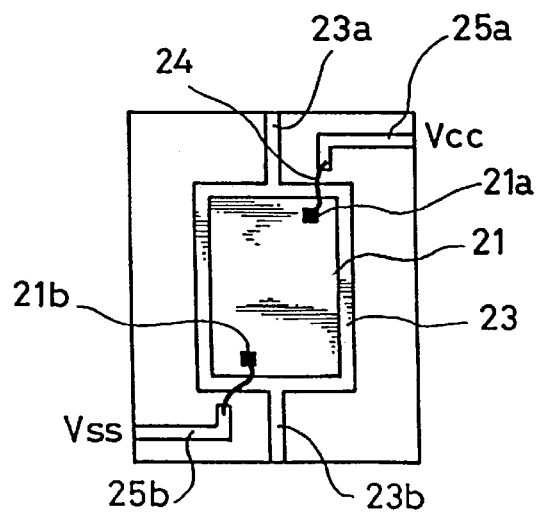
FIG. 2(B) is a plan view of the packing structure depicted in FIG. 2(A), prior to molding.
Figure 2C:
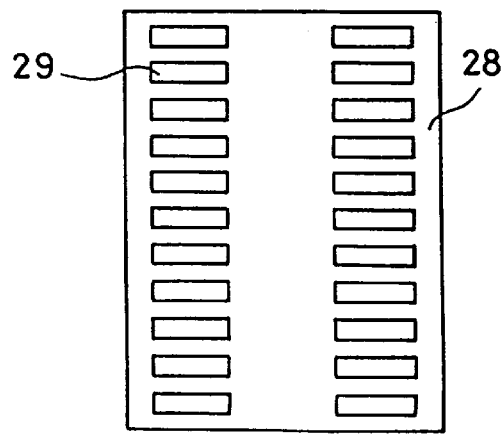
FIG. 2(C) is a plan view depicting a land pattern on a printed circuit board of the packing structure depicted in FIG. 2(A)

With reference now to FIGS. 3(A) through 3(C), the package (20) according to this invention has the same structure as that shown in FIGS. 2(A) through 2(C), except that the former has a nonconductive thin film, for example, a dielectric thin film (31) provided as a decoupling capacitor, this thin film (31) interconnecting the exposed surface of the die pad (23) and the conductive pattern (32) formed on an upper surface of a substrate, which for example, is a printed circuit board (38). The conductive pattern (32) is formed on the area corresponding to the exposed surface of the die pad (23). As shown in FIG. 3(B), if the contact terminal (23b) of the die pad (23) is electrically integrated with the inner lead (25d) which serves as a Vss, the pattern (32) is electrically connected to the Vcc land patterns (29) through a conductive pattern (not shown) inside the substrate (38). Alternatively, the pattern (32) may be electrically connected to the Vcc land patterns (29) or the Vss land patterns (29) through a conductive pattern (not shown) formed on the surface of the substrate (38).

Furthermore, although not shown in FIGS. 3(A) through 3(C), the die pad (23) also may be electrically integrated with the Vcc inner leads, while the pattern (32) may be electrically connected to the Vss land patterns (29).

The dielectric thin film (31) may be made of, for example, polyimide or epoxy resin, or metal oxides such as barium-titanium oxide ($BaTiO_3$), tantalium oxide ($Ta_2O$), silicon oxide ($SiO_2$) or silicon nitride ($Si_3N_4$), although these are not limiting to the present invention. A plurality of the dielectric thin films (31) may be formed, in the form of two parallel rows, between the die pad (23) and the pattern (32).

The voltage difference may be formed between the die pad and the conductive pattern by applying a Vcc and a Vss to the die pad (23) and the conductive pattern (32), respectively.

Figure 8:
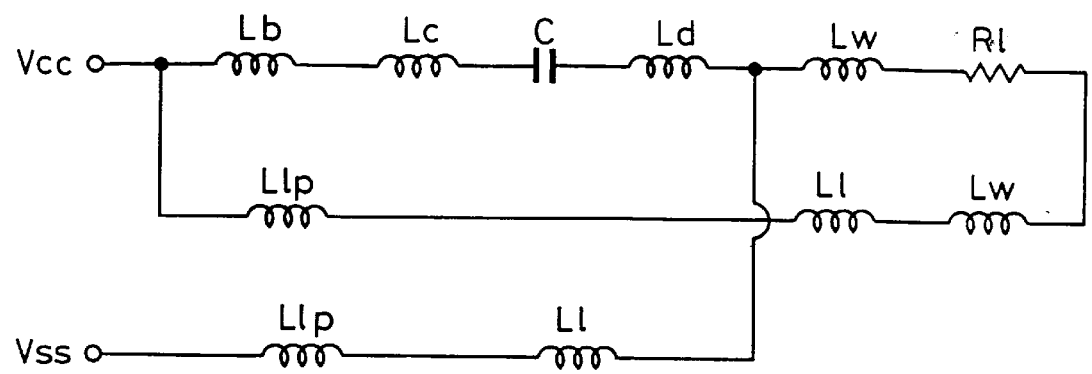
FIG. 8 is an equivalent circuit diagram of the packing structure depicted in FIG. 3.

In the equivalent circuit diagram of the package having such a packing structure, as can be seen from FIG. 8, the inductance (Lb) of the printed circuit board (38), the inductance (Lc) of the dielectric thin film (31), and the capacitance of the dielectric thin film (31) are interconnected in parallel to the inductance (Lw) of the bonding wires (24), the resistance (Rl) of the pattern on the chip (21), the inductance (Ll) of the lead, and the inductance (Llp) of the land pattern on the substrate (38), which are arranged in series. Accordingly, the package having the packing structure according to the present invention has a lower total resistance and inductance compared with those of the conventional packages; this contributes a reduction in the electrical noise an increase in the operation speed.

The semiconductor packages may be stacked in order to increase mounting density. In this case, the die pads of the individual packages are electrically commonly interconnected, and the dielectric thin film is then electrically contacted to the substrate and the lowest stacked package.

Now, another embodiment of the packing structure of the semiconductor packages in accordance with this invention will be explained with reference to FIG. 4. As shown in FIG. 4, the packing structure is same as that shown in FIG. 3(A) except that at least one conductive layer, for example, a plurality of solder bumps (41) replaces the dielectric thin film (31), and there is no voltage difference between the die pad (23) and the pattern (32). The solder bumps (41) are principally made of hard lead, and also may be made of gold, silver, copper, aluminum, or alloys thereof, which are plated with hard lead. The solder bumps (41) may be soldered by using a solder reflow process, which is well known to the art. And, the conductive layer may be formed in the form of single layer throughout the space between the die pad (23) and the pattern (32).

With reference now to FIG. 5(A), contact terminals (23a) (23b) are integrated with the die pad (23) at the opposite corners thereof, and the bonding pads (21a) (21b) are electrically connected to the Vcc and Vss inner leads (25a) and (25d) on the printed circuit board (38), via bonding wires (24), respectively. The inner lead (25a) is directed away from the contact terminal (23a), and the inner lead (25d) is electrically integrated with the contact terminal (23b).

With reference now to FIG. 5(B), there are formed on the upper surface of the printed circuit board two parallel rows of land patterns (29), to which outer leads (27) are mounted, and a conductive pattern (32) is formed between these two rows of land patterns (29). The pattern (32) is electrically connected to the die pad (23) in parallel to each other by a plurality of bumps (41), and further electrically connected to the Vss land patterns (29) by the conductive pattern (43) formed on the surface of the printed circuit board (38). The pattern (32) may be electrically connected to the Vss land patterns (29) by a conductive pattern (not shown) formed inside the printed circuit board (38).

Figure 6A:
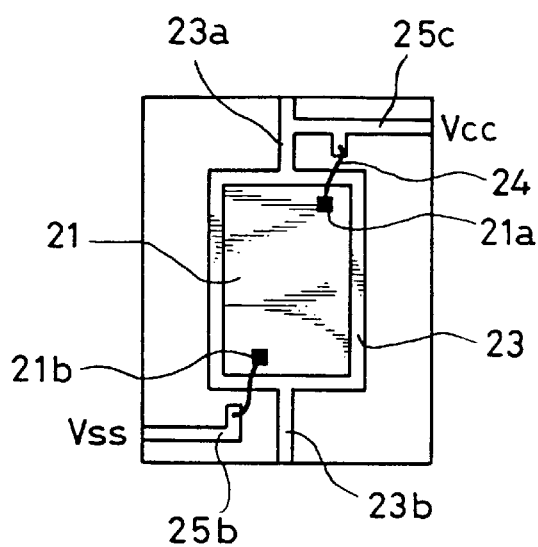
FIG. 6(A) is a plan view of a modified embodiment of the packing structure depicted in FIG. 4, prior to molding.

With reference now to FIG. 6(A), the packing structure has the same configuration as that shown in FIG. 5(A), except that the inner lead (25c) is electrically integrated with the contact terminal (23a), and the inner lead (25b) is formed so as to depart away from the contact terminal (23b).

Figure 6B:
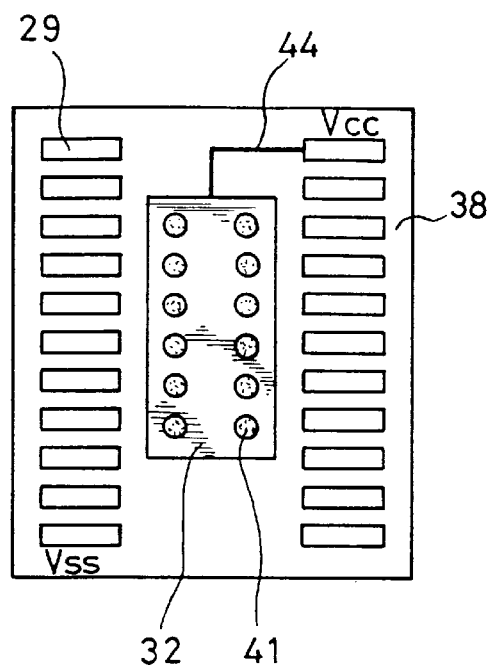
FIG. 6(B) is a plan view depicting a land pattern on a printed circuit board of the packing structure depicted in FIG. 6(A)

Moreover, with reference now to FIG. 6(B), the packing structure has the same configuration as that shown in FIG. 5(B), except that the pattern (32) is electrically connected to the Vcc land pattern (29) by a conductive pattern (44) formed on the surface of the printed circuit board (38). The pattern (32) may be electrically connected to the Vss land patterns (29) by a conductive pattern (not shown) formed inside the printed circuit board (38).

Figure 7A:
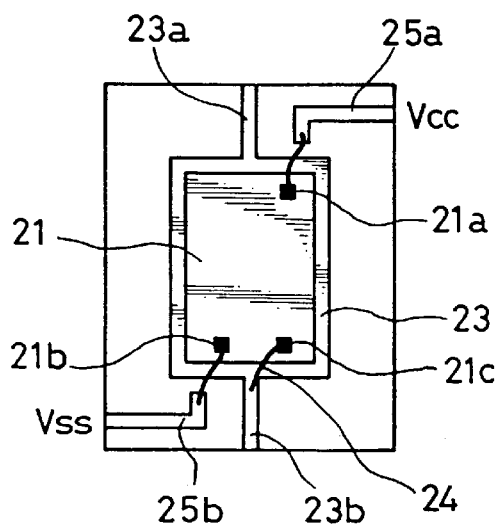
FIG. 7(A) is a plan view of an alternative embodiment of the packing structure depicted in FIG. 4, prior to molding.

With reference now to FIG. 7(A), the packing structure has the same configuration as that shown in FIG. 5(A), except that the inner lead (25b) is separated from the contact terminal (23b), and the bonding pad (21c) is electrically connected to the contact terminal (23b) by a bonding wire (24).

Figure 7B:
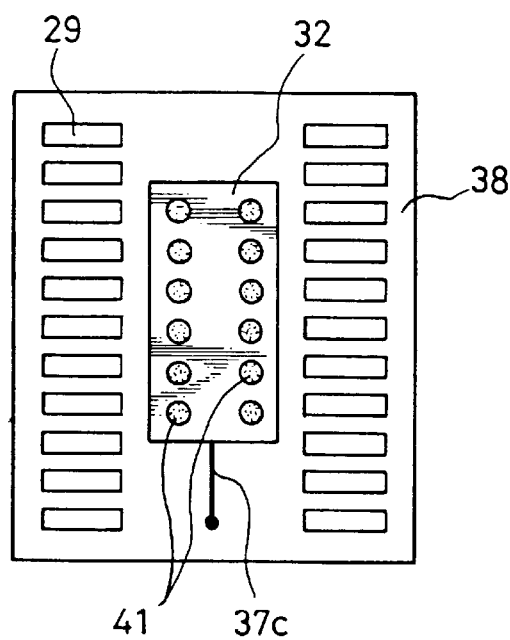
FIG. 7(B) is a plan view depicting a land pattern on a printed circuit board of the packing structure depicted in FIG. 7(A)

Moreover, with reference now to FIG. 7(B), the packing structure has the same configuration as that shown in FIG. 5(B), except that the pattern (32) is electrically connected to the Vbb conductive pattern (37c) formed on the surface of the printed circuit board (38).

The semiconductor packages having the packing structures depicted in FIGS. 4 through 7 may be stacked in order to increase mounting density. In this case, the die pads of the individual packages are electrically commonly interconnected, and the dielectric thin film is then electrically contacted to the substrate and to the lowest stacked package. The smaller the cross-sectional areaof the bumps and the larger the number of bumps, the lower the electric noise of the semiconductor package.

Figure 9:
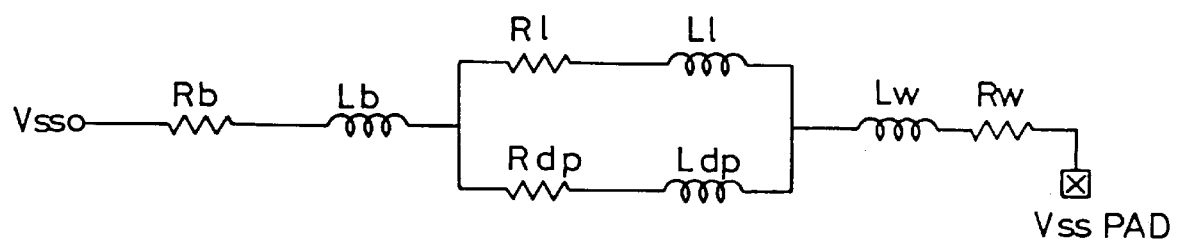
FIG. 9 is an equivalent circuit diagram of the packing structure depicted in FIG. 4.

Now, as can be seen from FIG. 9, there are two paths to transfer Vss supplied from the Vss land pattern on the printed circuit board to the Vss bonding pad on the semiconductor chip: for the first path, the Vss land pattern on the printed circuit board is designed to be transferred to the Vss bonding pad on the chip through the die pad and bonding wire of the semiconductor package; and for the second path, the the Vss land pattern on the printed circuit board is designed to be transferred to the Vss bonding pad on the chip through the lead and bonding wire of the semiconductor package. These two paths are interconnected in parallel. Accordingly, the circuit diagram thereof, which is shown in FIG. 9, in the resistance (Rb) and inductance (Lb) of the printed circuit board, the resistance (Rdp) and inductance (Ldp) of the die pad, and the resistance (Rw) and inductance (Lw) are interconnected in series, and the resistance (Rl) and inductance (Ll) of the lead are connected to both ends of the series of the resistance (Rdp) and inductance (Ldp) in parallel. Accordingly, the package having the packing structure according to the present invention has lower total resistance and inductance compared with those of the conventional packages, thereby reducing the time delay of the transferred signals.

As described above, the packing structure of semiconductor packages wherein at least one semiconductor chip is mounted on a die pad; a conductive pattern is formed on the area of the upper surface of the printed circuit board, the area corresponding to the die pad; a nonconductive thin film or conductive layer is formed in a space between the die pad and the conductive pattern; and the die pad and conductive pattern is electrically connected so as to generate a voltage difference therebetween, thereby forming a parallel electric path between the Vss (Vcc) land pattern on the printed circuit board and the Vcc (Vss) bonding pad on the chips, allowing a reduction in the total impedance of the packages and of the electric noise, and an increase in the operation speed.

Further, the packing structure according to the present invention has another advantage that, since the capacitor for reducing the electric noise is formed on the precise area where the package will be mounted, the mounting density does not reduce proportionately as the total impedance of the package decreases.

Although preferred embodiments of the present invention have been described in detail hereinabove, it should be clearly understood that many variations and/or modifications of the basic inventive concepts herein taught which my appear to those skilled in the art will still fall within the spirit and scope of the present invention as defined in the appended claims.

What is claimed is:

1. A reduced electrical noise packing structure for a semiconductor package comprising:

a semiconductor package comprising a die pad having an upper surface and a bottom surface exposed from the package and having at least one semiconductor chip mounted on said upper surface of the die pad;

a substrate; said package being mounted on said substrate; said substrate having an upper surface; a conductive pattern formed on an area of said upper surface of said substrate; and a nonconductive thin film in a space between said die pad and said conductive pattern, said film being contact with said bottom surface of said die pad and with said conductive pattern of the substrate, said space being arranged to experience a voltage difference, in respect to which said nonconductive thin film serves as a capacitor, upon application of different voltages to said die pad and said conductive pattern.

2. The packing structure of claim 1, wherein:

said area corresponds in position, horizontally of said structure, to that of said die pad, but being spaced vertically of said structure so as to provide said space.

3. The packing structure as claimed in claim 1, wherein said nonconductive thin film is a dielectric thin film.

4. The packing structure as claimed in claim 3, wherein said dielectric thin film is made of a resin.

5. The packing structure as claimed in claim 4, wherein said dielectric thin film is made of polyimide or epoxy resin.

6. The packing structure as claimed in claim 3, wherein said dielectric thin film is made of a metal oxide.

7. The packing structure as claimed in claim 6, wherein said dielectric thin film is made of tantalium oxide, barium-titanium oxide, silicon oxide or silicon nitride.

8. The packing structure as claimed in claim 1, wherein said nonconductive thin film is provided as a plurality of nonconductive thin layer portions spaced horizontally from one another and arranged in more than two parallel rows each including a plurality of said portions.

9. The packing structure as claimed in claim 1, wherein said die pad is electrically integrated with an inner lead, for application of voltage to said die pad.

10. A reduced electrical noise packing structure for a semiconductor package comprising:

a semiconductor package comprising a die pad having an upper surface and a bottom surface exposed from the package and having at least one semiconductor chip mounted on said upper surface of the die pad;

a substrate; said package being mounted on said substrate; said substrate having an upper surface; a conductive pattern formed on an area of said upper surface of said substrate; and at least one conductive layer formed in a space between the die pad and the conductive pattern, whereby, in use there is no voltage difference between said die pad and said conductive pattern.

11. The packing structure of claim 10, wherein:

said area corresponds in position, horizontally of said structure, to that of said die pad, but being spaced vertically of said structure so as to provide said space.

12. The packing structure as claimed in claim 10, wherein said at least one conductive layer includes a plurality of conductive layers electrically connected in parallel.

13. The packing structure as claimed in claim 10, wherein said conductive layers are metal bumps.

14. The packing structure as claimed in claim 10, wherein the die pad is electrically integrated with an inner lead for application of voltage to said die pad.

15. The packing structure as claimed in claim 10, wherein the conductive layer is made of hard lead, or gold, silver, copper, aluminum, or alloys thereof plated with hard lead.

* * * * *